(12) United States Patent
Suzuki

(10) Patent No.: US 6,300,601 B1
(45) Date of Patent: Oct. 9, 2001

(54) LAMP UNIT AND LIGHT RADIATING TYPE HEATING DEVICE

(75) Inventor: Shinji Suzuki, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/624,334

(22) Filed: Jul. 24, 2000

(30) Foreign Application Priority Data

Jul. 22, 1999 (JP) .................................................. 11-207203

(51) Int. Cl.[7] ...................................................... A21B 1/00
(52) U.S. Cl. ......................... 219/411; 219/390; 219/405; 118/724; 118/725; 392/416
(58) Field of Search ..................... 219/390, 405, 219/411; 118/724, 725, 50.1; 392/416, 418

(56) References Cited

U.S. PATENT DOCUMENTS

| | | |
|---|---|---|
| 4,859,832 | 8/1989 | Uehara et al. |
| 5,194,401 * | 3/1993 | Adams et al. ............... 437/173 |
| 5,856,652 * | 1/1999 | Mayuzumi .................. 219/405 |
| 6,222,990 * | 4/2001 | Guardado et al. .......... 392/416 |

* cited by examiner

Primary Examiner—Teresa Walberg
Assistant Examiner—Shawntina T. Fuqua
(74) Attorney, Agent, or Firm—Nixon Peabody LLP; David S. Safran

(57) ABSTRACT

A plurality of filament lamps having filaments arranged within an annular light emitting tube are arranged coaxially within a plane to provide a group of lamps, and a plurality of groups of lamps are arranged in a step-like manner with their centers coinciding with each other to form a lamp unit LU. A lamp chamber having this lamp unit arranged therein is provided with a cooling air inlet port and a cooling air outlet port. An inner surface of a side wall of the lamp chamber is provided with a mirror. A workpiece holding block arranged in a light radiation chamber below the lamp chamber can be rotated.

4 Claims, 5 Drawing Sheets

FIG. 3
(PRIOR ART)
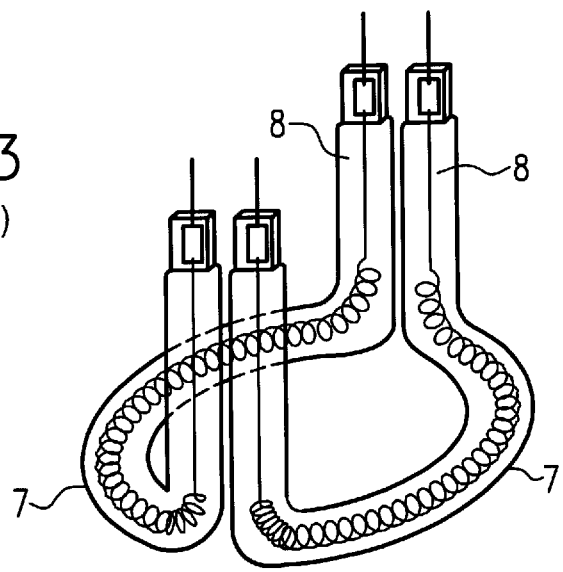
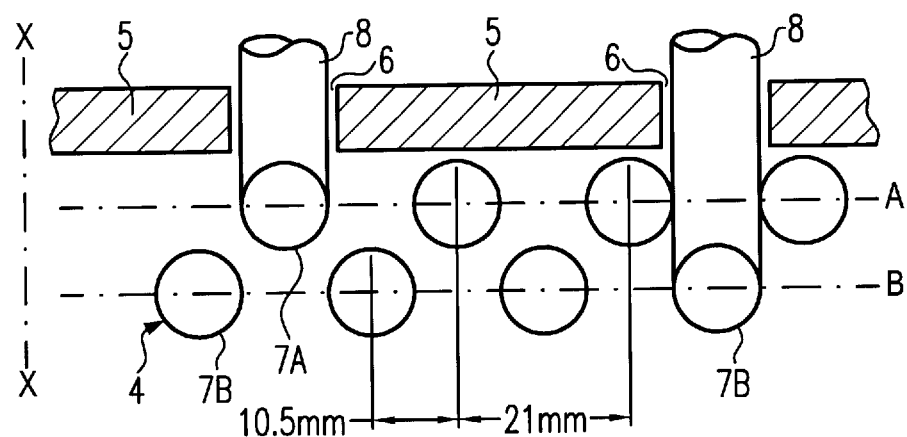
FIG. 4
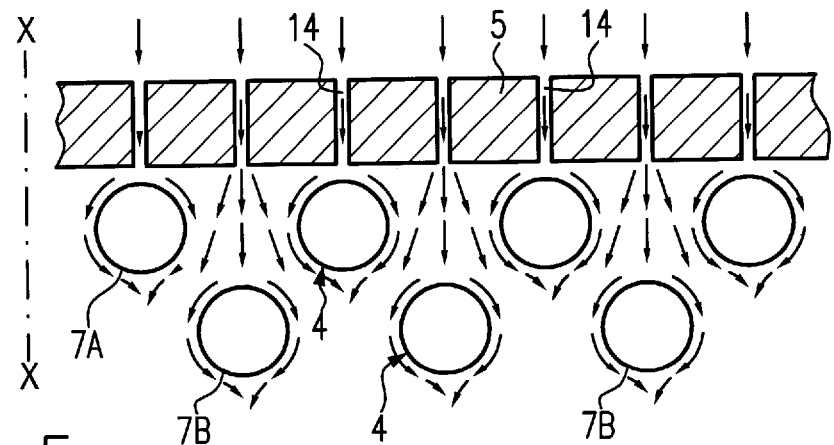
FIG. 5

LAMP UNIT AND LIGHT RADIATING TYPE HEATING DEVICE

BACKGROUND OF THE INVENTION

1. Field of the Invention

This invention relates to a lamp unit for use in a heating treatment through light radiation to carry out some processing such as layer formation, diffusion, annealing or the like for a workpiece such as a semiconductor wafer and to a light radiation type heating device using this lamp unit. More particularly, the invention relates to a lamp unit capable of performing, for example, a high-speed heating process to form a shallow connecting surface at the annealing stage for the semiconductor wafer and to a light radiation heating device using this lamp unit.

2. Description of Related Art

In a semiconductor manufacturing stage, a light radiation heating device for performing a heating treatment with light containing a large amount of infrared rays radiated from filament lamps is used in order to perform processing such as layer formation, diffusion, annealing or the like. Although all these processes perform a heating operation for heating a semiconductor wafer up to a high temperature, application of a light radiation heating processing device enables the semiconductor wafer to be rapidly heated, and its temperature can be increased up to 1000° C. or more within tens and several seconds to several tens seconds, for example. In addition, if the light radiation is stopped, the semiconductor wafer can be cooled rapidly.

FIG. 1 is a cross-sectional view of a prior art light radiation heating device. Filament lamps 4 to be described later are arranged in a lamp chamber 1 and a mirror 5 is installed at the rear surfaces of the filament lamps 4. A light radiation chamber 2 and a quartz window 9 define this lamp chamber 1. Within the light radiation chamber 2 a semiconductor wafer W is mounted which acts as a workpiece that is heated and processed on a wafer holding block 3. In addition, the quartz window 9 is used in case the atmosphere near the semiconductor wafer W is different from the atmosphere in the lamp chamber 1.

One example of a filament lamp 4 is illustrated in FIG. 2, wherein a seal member for the filament lamp 4 includes an annular light emitting tube 7, a pair of inlet tubes 8 which are cooperatively arranged at a right angle to the end of the light emitting tube 7, and a filament 12 having a tungsten raw wire wound in a helical form installed within the light emitting tube 7. A seal section 11 is formed at the end part of each inlet tube 8. The end of the filament 12 and the lead wire 19 are connected at the seal section 11 through a molybdenum foil 11a. Within the sealed member is enclosed a small amount of halogen gas together with inert gas.

As shown in FIG. 3, the annular light emitting tubes 7 of the filament lamp 4 are constructed such that the light emitting tubes 7 of semi-circular or divided circle or arcuate shape are combined to form a circular shape.

In FIG. 1, the light emitting tubes 7 are of circular shape, and a plurality of filament lamps 4 having different diameters D are arranged such that the light emitting tubes 7 are installed in a concentric manner around a center X of the circle. The mirror 5 arranged at the rear surfaces of the filament lamps 4 is made of metal, for example, aluminum, and there are provided some concentric grooves 13 covering the light emitting tubes 7 of the filament lamps 4 and through-pass holes 6 into which the inlet tubes 8 are inserted. The reflecting surface of the mirror 5 is provided with metallic plating, such as a gold plating, so as to attain an improved reflection of light. The light emitting tube 7 of each of the filament lamps 4 is arranged and fitted in the concentric grooves of the mirror 5. In addition, the inlet tube 8 of each of the filament lamps 4 is inserted into the through-pass hole 6 of the mirror 5 and protrudes from the rear surface of the mirror 5.

Accordingly, as electrical power is fed to the filament lamps 4, a filament 12 may produce and radiate light. The light is reflected at the mirror 5 and radiated against the semiconductor wafer W on the wafer holding block 3 within the light-radiating chamber 2.

In recent years, it has become necessary to attain a high integrated formation and ultra fine arrangement of a semiconductor integrated circuit, wherein it has been most important to make a thin diffusion layer containing some impurities and to form a shallow junction surface during a stage in which the impurities are implanted into and diffused in the silicon crystal in the semiconductor wafer, for example through an ion implanting process. Although the diffusion of impurities performed through the ion implanting process is carried out at an implanting stage in which the ionized impurities are accelerated with an electric field and physically implanted into the silicon crystal and also at an annealing stage in which the impurities are diffused in the crystal while the damage of the crystal through implanting of impurities is being recovered, it is necessary to restrict the diffusion of impurities to attain a thin diffusion layer at an annealing stage in order to form a shallow junction surface and further in order to obtain a thin diffusion layer by making the temperature increasing speed of the semiconductor wafer high. If the temperature increasing speed is slow, the annealing processing time is extended, the diffusion of the impurities exceeds a predetermined diffusion layer thickness and the layer becomes too thick. In turn, if the layer thickness of the diffusion layer is required to have 0.13 to 0.15 $\mu$m, for example, it becomes necessary to have a temperature increasing speed of 150 to 200° C./sec.

However, in the case of the prior art light radiation heating device, the temperature increasing speed of the semiconductor wafer was approximately 50 to 100° C./sec. Accordingly, due to the recent years request of a higher integration and more fine formation of the semiconductor integrated circuit, the annealing stage for the diffusion of impurities by an ion implanting process cannot accommodate for the requirement of making thin diffusion layers of impurities and of forming a shallow junction surface.

SUMMARY OF THE INVENTION

In view of the foregoing, the present invention provides a lamp unit and a light radiation heating device in which a lamp input density (a lamp input per unit area) is high, an efficient cooling of the lamp is easily carried out and an increasing in temperature of the semiconductor wafer can be attained at a higher speed than that of the prior art systems.

The lamp unit of the invention has a light emitting tube with an annular shape. A plurality of filament lamps having different diameters from each other are arranged with their light emitting tubes positioned in a concentric manner in the same plane to form a group of lamps and a plurality of groups of lamps are arranged in a step-like manner with their centers being coincident with each other.

In addition, the light radiation heating device of the invention has a lamp chamber with a lamp unit arranged therein which is provided with a cooling air inlet port and a cooling air outlet port in order to efficiently cool the lamp.

Moreover, an inner surface of a side wall of the lamp chamber can be provided with a mirror in order to improve radiation efficiency.

Additionally, a workpiece holding block arranged within the light radiation chamber below the lamp chamber can be rotated in such a way that the semiconductor wafer, acting as the workpiece can be heated uniformly.

As described above, the lamp unit of the present invention has light emitting tubes with an annular shape. The light emitting tubes of a plurality of filament lamps having different diameters of the annular shape are arranged concentrically within the same plane to form a group of lamps. A plurality of groups of lamps are arranged in a step-like manner with their centers being coincident with each other, resulting in that the lamp arrangement pitch can be reduced and a lamp input density can be increased to quite a high value. In addition, even if the lamp arrangement pitch is kept low, the distance between the adjoining filament lamps can be increased and cooling air passes between the lamps, resulting in that a sufficient cooling of the lamps can be attained.

Accordingly, the light radiation heating device using the lamp units as above enables a temperature of the semiconductor wafer, acting as a workpiece, to be quite rapidly increased and further enables the device to make a shallow junction surface at the annealing stage of the semiconductor wafer. Additionally, the lamp chamber is provided with a cooling air inlet port and a cooling outlet port to perform a cooling operation, resulting in that the lamps can be efficiently cooled. Further, when the side wall of the lamp chamber is a mirror, a reduction in illumination at the circumferential edge of the semiconductor wafer can be restricted and the light of the lamps can be effectively utilized. In addition, when the light is radiated while the semiconductor wafer W is being rotated, the illumination of the surface of the semiconductor wafer is made uniform in a circumferential direction of the wafer and it is possible to attain a superior distribution of illumination.

These and further objects, features and advantages of the present invention will become apparent from the following description when taken in connection with the accompanying drawings which, for purposes of illustration only, show several embodiments in accordance with the present invention.

BRIEF DESCRIPTION OF THE DRAWINGS

FIG. 3 is a perspective view showing a prior art filament lamp having a semi-circular light emitting tube;

FIG. 4 is a cross-sectional view showing a preferred embodiment of a lamp unit of the present invention;

FIG. 5 is a cross-sectional view showing a flow of cooling air in the lamp unit of FIG. 4;

DETAILED DESCRIPTION OF THE INVENTION

Figure 1:
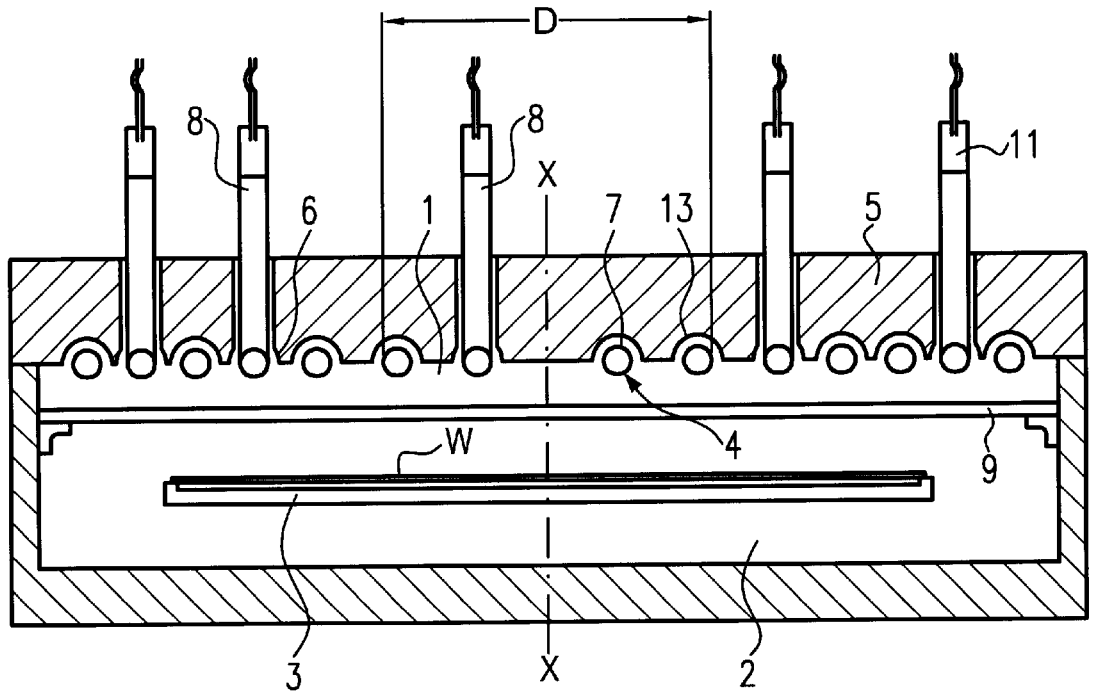
FIG. 1 is a cross-sectional view of a prior art light radiation heating device.
Figure 2:
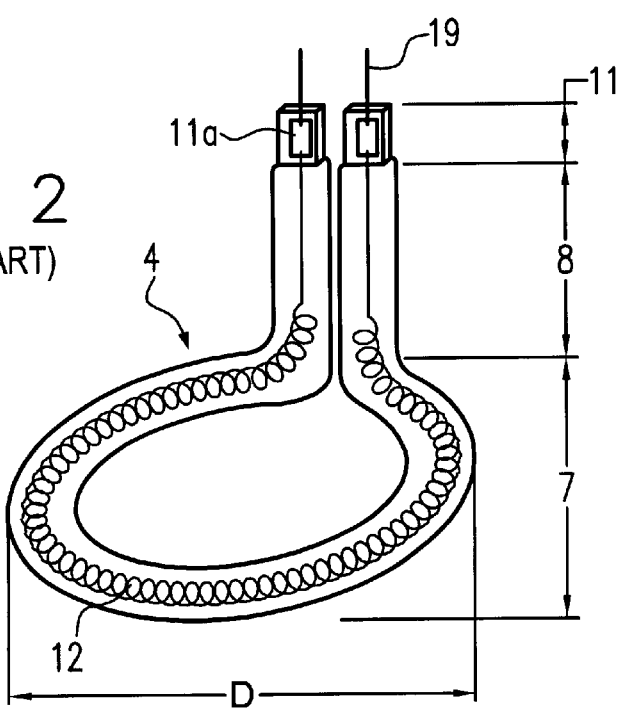
FIG. 2 is a perspective view showing an annular filament lamp as used in the device according to FIG. 1.

Referring now to the drawings, some preferred embodiments of the present invention will be described in more detail. FIG. 4 is a cross-sectional view showing a preferred embodiment of the lamp unit of the present invention used in the light radiation heating device. The light emitting tubes 7A are arranged in annular form and a plurality of filament lamps 4 having different diameters to each other are installed in front of a reflection surface of the mirror 5 in a concentric manner around a center X of the annular ring within the same plane indicated by an imaginary line A, wherein these lamps are a first group of lamps. More practically, the light emitting tubes 7 of filament lamps 4 with a tube diameter of 10 mm are arranged in a pitch of 21 mm. The light emitting tubes 7 are shown in their sectional view and their inner filaments are not illustrated.

Similarly, the light emitting tubes 7B are of an annular form, a plurality of filament lamps 4 having different diameters from each other are arranged in a concentric manner around a center X of the annular arrangement within the same plane indicated by an imaginary line B and these lamps are a group of second lamps. Then, the first lamp group and the second lamp group are arranged in two stages. Each of the centers of each of the concentric circles is coincident with the center X, and the light emitting tubes 7A of the first group of filament lamps 4 are positioned at an intermediate location of the adjacent two light emitting tubes 7B of filament lamps 4 in the second group of lamps. That is, the light emitting tubes 7A and 7B of the first group of lamps and second group of lamps are arranged in a zigzag form as seen in a sectional view of FIG. 4 and the level corresponding to the position of the semiconductor wafer, i.e. the height levels are made alternatively different from each other at the adjacent filament lamps 4. The filament lamp 4 in the second group of lamps also has a tube diameter of 10 mm and they are arranged at a pitch of 21 mm. Accordingly, a pitch of light emitting tubes 7 of the adjacent filament lamps 4 of the first group of lamps and the second group of lamps is 10.5 mm, wherein the light emitting tubes 7 of the adjacent filament lamps 4 as seen from their top plan views are almost contacted to each other, their arrangement pitch is remarkably low as compared with that of the prior art and then a lamp input density can be increased.

Figure 10:
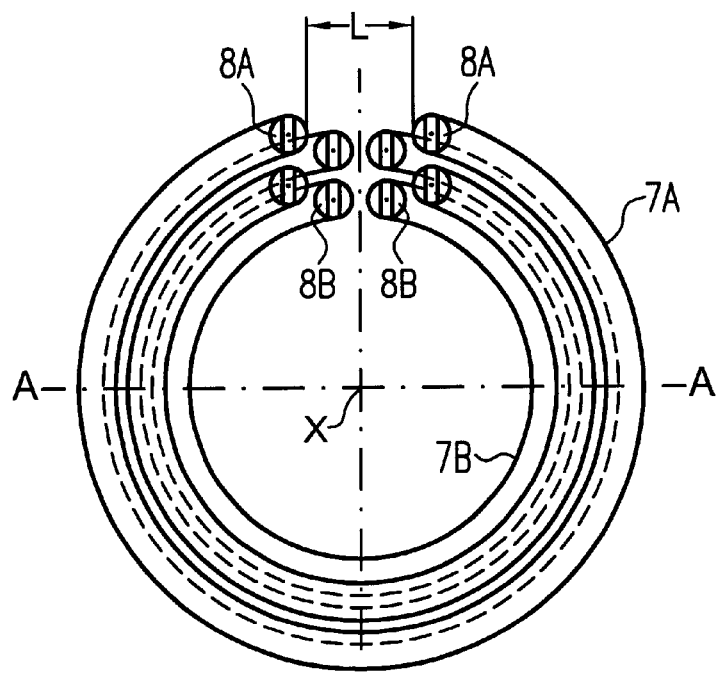
FIG. 10 is a top plan view showing a lamp unit having a low arrangement pitch.
Figure 11:
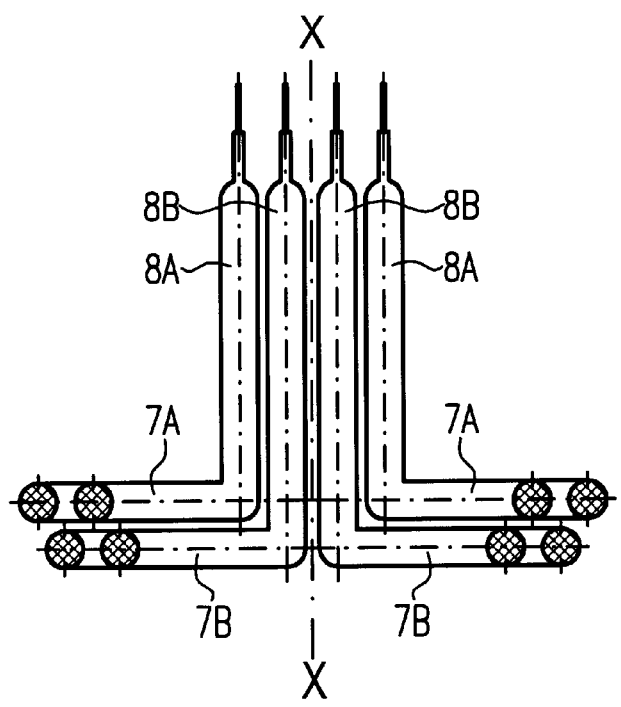
FIG. 11 is a cross-sectional view taken along line A—A of FIG. 10.

In FIGS. 10 and 11 is shown one example in which the centers of each of the concentric circles of the first group of lamps and the second group of lamps are coincident with each other. The light emitting tubes 7A are the first group of lamps arranged in a concentric circle manner within the same plane and the light emitting tubes 7B are the second group of lamps. The center X of the concentric circle of the first group of lamps of the light emitting tubes 7A and the center X of the concentric circle of the second group of lamps of the light emitting tubes 7B are coincident with each other as seen from a direction perpendicular to an annular ring formed by the light emitting tubes 7 as shown in FIG. 10.

In addition, as described above, the filament lamps of each of the groups of lamps may be constructed such that the light emitting tubes 7 are annular as shown in FIGS. 10 and 11, or a plurality of sets of lamps having divided semi-circle or arcuate-shaped light emitting tubes from the annular shape as shown in FIG. 3 are arranged in an annular form.

In such a lamp unit as described above, when the filament lamps 4 having an input electrical power of 180 W/cm per unit length of the filament are arranged in a pitch of 10.5 mm and lit, it is possible to increase the temperature of the semiconductor wafer at a speed of about 150° C./sec, and it can be adapted to make a shallow junction surface at the annealing stage of the semiconductor wafer.

As described above, irrespective of the fact that the arrangement pitch is quite small, height levels of the adjacent filament lamps 4 are different from each other, so that a distance in a slant direction between the adjacent filament lamps 4 is increased. Accordingly, as shown in the sectional view of FIG. 5, cooling of the filament lamps 4 can be performed efficiently by a method wherein the mirror 5 is provided with a small-diameter round hole or a slit-like aeration part 14. Cooling air is blown through the aeration part 14 or the air is discharged through it, resulting in that the cooling air passes between the filament lamps 4 and efficient cooling can be carried out.

Figure 6:
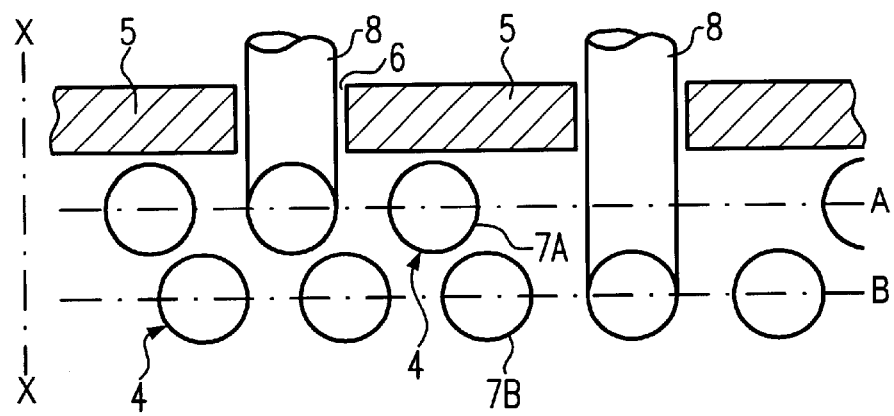
FIG. 6 is a cross-sectional view showing a lamp unit of another preferred embodiment of the present invention.

FIG. 6 is a cross-sectional view showing an example in which an arrangement pitch of the lamps is further reduced. Although the arrangement in which the first group of lamps having a plurality of light emitting tubes 7A of filament lamps 4 arranged in a concentric manner within the same plane indicated by the imaginary line A and the second group of lamps having a plurality of light emitting tubes 7B of filament lamps 4 arranged in a concentric manner within the same plane indicated by the imaginary line B are arranged in a step-like manner is the same as that of the example shown in FIG. 4, the light emitting tubes 7 of the filament lamps 4 with a tube diameter of 10 mm are arranged in a pitch of 7.5 mm. That is, the spacing between the light emitting tubes 7 of the adjacent filament lamps 4 is smaller than the tube diameter. Accordingly, the adjacent filament lamps 4 are partially overlapped from each other as seen in their top plan views. Their arrangement pitch is also smaller than that of the example shown in FIG. 4. Thus, the lamp input density can be increased further and the semiconductor wafer can be heated at a speed of about 210° C./sec.

Also in this case, the distance in a slant direction between the light emitting tubes 7 of the adjoining filament lamps 4 is high irrespective of a small arrangement pitch, so that the cooling air may pass between the light emitting tubes 7 and an efficient cooling can be carried out.

Figure 7:
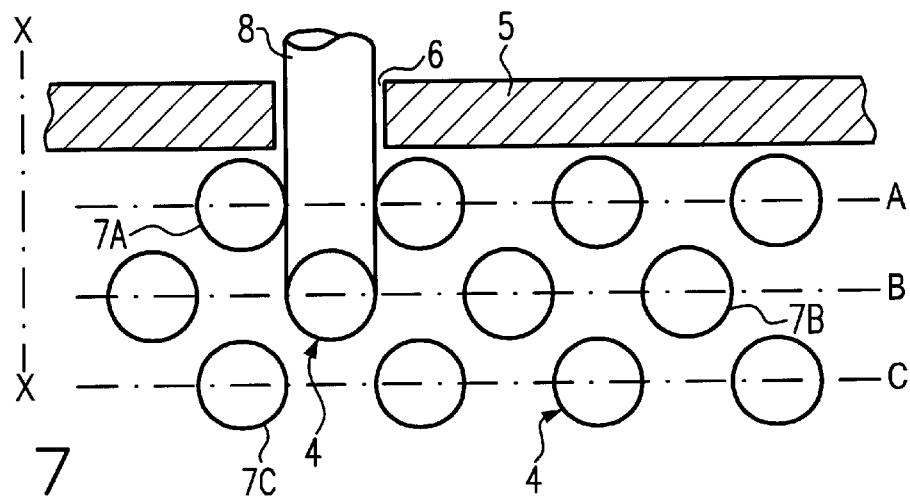
FIG. 7 is a cross-sectional view showing a lamp unit of a still further preferred embodiment of the present invention.

FIG. 7 shows an example in which a third group of lamps arranged in a concentric manner within the same plane indicated by an imaginary line C in addition to the first group of lamps arranged in a concentric manner within the same plane indicated by the imaginary line A and the second group of lamps arranged in a concentric manner within the same plane indicated by the imaginary line B are arranged in three steps. As described above, it is also possible to arrange the groups of lamps in a multi-step manner with more than three steps and it is natural to say that the lamp input density can be increased further than that of the two-step group of lamps. As illustrated in this Figure, even if the light emitting tubes 7A and the light emitting tubes 7C are arranged to be overlapped with each other, light may pass through them due to the transparency of the light emitting tubes 7, and the filaments in the light emitting tubes 7 are quite small in size so that they do not hinder the path of light. Accordingly, the light radiated from the light emitting tubes 7A is radiated against the workpiece without being interrupted by the light emitting tubes 7B and 7C.

Figure 8:
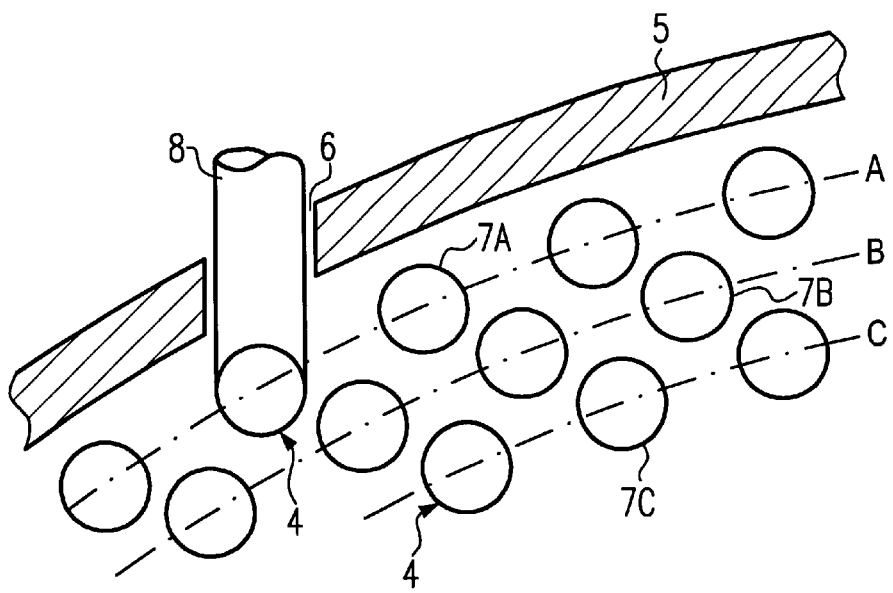
FIG. 8 is a cross-sectional view showing a lamp unit of a still further preferred embodiment of the present invention.

The arrangement of the lamps is not limited to a plane as found in the aforesaid examples, but it may be a gradual curved surface as shown in FIG. 8. This may be applied in cases where the circumferential part of the semiconductor wafer is radiated with light more strongly than the central part in order to accommodate for heat radiated from the circumferential edge of the semiconductor wafer acting as a workpiece during a heat processing stage.

Figure 9:
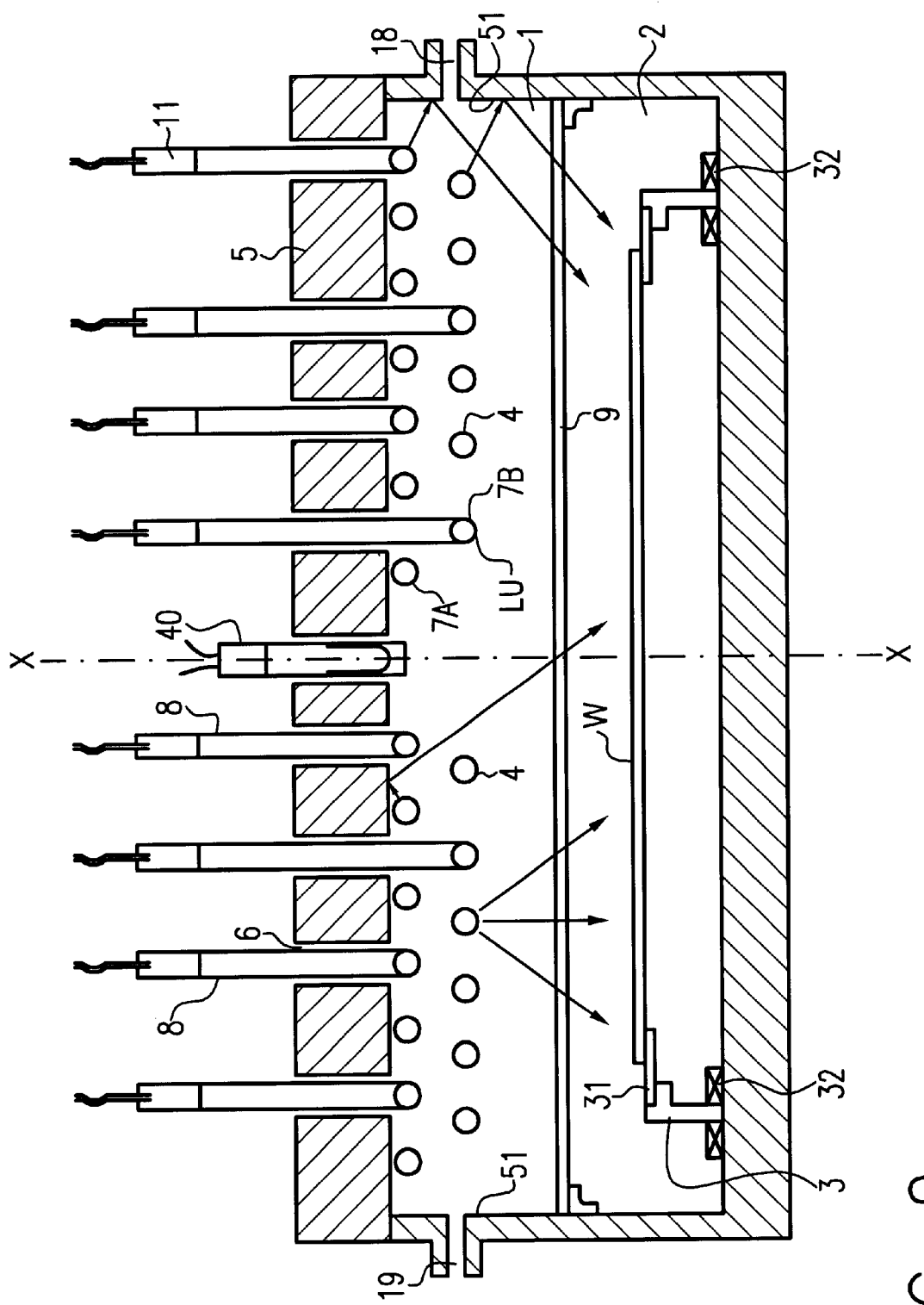
FIG. 9 is a cross-sectional view showing a light radiation heating device using a lamp unit of the present invention.

FIG. 9 shows a preferred embodiment of the light radiation heating device using the lamp unit of the present invention, wherein the basic structure of the heating device is the same as that shown in FIG. 1. That is, a lamp unit LU of the present invention is arranged within the lamp chamber 1 having a lower part acting as a radiation port. In addition, a mirror 5 is arranged at the rear surface of the lamp unit LU. Since the lamp unit LU uses the annular filament lamps 4, it is difficult to arrange the light emitting tubes 7 at the central part. Due to this fact, a single end halogen lamp 40 is arranged at the center of the lamp unit LU and its central part can also be radiated in the same illumination.

Each of the right and left side walls of the lamp chamber 1 is provided with a cooling air inlet port 18 and a cooling air outlet port 19, respectively, wherein cooling air passes across the lamp chamber 1 to cool the filament lamps 4. When cooling with this cooling air and cooling with cooling air flowed from the aeration part 14 formed at the mirror 5 shown in FIG. 5 are properly carried out concurrently, an efficient cooling of the filament lamps 4 can be performed. In addition, the inner surfaces of the right and left side walls of the lamp chamber 1 are provided with a metallic plating efficiently reflecting the infrared rays so that the side walls may become a mirror 51.

Within the light radiation chamber 2 separated from the lamp chamber 1 by the quartz window 9 is installed a wafer holding block 3. The wafer holding block 3 is formed in an annular shape extending along a shape of the semiconductor wafer W in order to hold the semiconductor wafer W through a guard ring 31. The lower end of the wafer holding block 3 is provided with a bearing 32, wherein the wafer holding block 3 is driven by a rotating mechanism (not shown) and further rotated around the center of the wafer holding block 3 indicated by a dotted line in FIG. 9, i.e. a substantial center of the semiconductor wafer W.

Referring to FIGS. 10 and 11, the reason why the wafer holding block 3 can be rotated will be described. FIG. 10 is a top plan view showing a lamp unit LU in which an arrangement pitch of the light emitting tubes 7 is reduced and the spacing between the adjoining light emitting tubes 7 is smaller than the tube diameter of the light emitting tube 7. FIG. 11 is a cross-sectional view taken along line A—A of FIG. 10, wherein the arrangement pitch of the light emitting tubes 7 is low and the spacing between the adjoining light emitting tubes 7 is smaller than the tube diameter of the light emitting tube 7, so that it is not possible for a pair of inlet tubes 8B, 8B in the second group of lamps positioned below are passed between the light emitting tubes 7A, 7B of the first group of lamps positioned above. Due to this fact, it is necessary that the spacing L between a pair of inlet tubes 8A, 8A in the first group of lamps positioned above is set to a size where the inlet tubes 8B, 8B of the second group of lamps may pass. Then, since there is no presence of the light emitting tubes 7A between a pair of inlet tubes 8A, 8A having a large spacing L therein, the light strength at this part is decreased and the degree of uniformity of illumination distribution on the semiconductor wafer W is deteriorated. However, as the wafer holding block 3 is rotated, the portions where the light emitting tubes 7A are not present are relatively rotated so that the illumination at the surface of the semiconductor wafer W is unified in a circumferential direction and it is possible to prevent the degree of uniformity in the illumination distribution from being deteriorated.

In this way, the annular guard ring 31 made of ceramic material, for example, SiC, which has the same material quality or similar thermal characteristic as that of the semiconductor wafer W is mounted on the wafer holding block 3, the semiconductor wafer W is mounted on the guard ring 31 and the circumferential edge of the semiconductor wafer W is held by the guard ring 31. Then, cooling air is fed into the lamp chamber 1 and at the same time the wafer holding block 3 is rotated and the filament lamps 4 and the halogen lamp 40 in the lamp unit LU are lit. The light of the filament lamps 4 is radiated from all the circumferences of the light emitting tubes 7 and the light is radiated against the semiconductor wafer W. The light radiated in an opposite direction to the semiconductor wafer W is reflected at the mirror 5 and radiated against the semiconductor wafer W. The light radiated toward a side wall direction of the lamp chamber 1 is also reflected against the mirror 51 and radiated against the semiconductor wafer W. If there is no mirror 51, the light at the outer circumference of the lamp escapes in a lateral direction, so that the illumination at the circumferential edge of the semiconductor wafer W is decreased as compared with that of the center part. However, arrangement of the mirror 51 enables the reduction of illumination at the circumferential edge of the semiconductor wafer W to be restricted and further an efficient utilization of the light can be attained.

Although the temperature of the semiconductor wafer W is increased under radiation of light, the high value of lamp input density of the lamp unit LU enables its temperature to be quite rapidly increased as described above. In addition, irrespective of the fact that the lamp arrangement pitch of the lamp unit LU is low, the light emitting tubes 7 of the filament lamps 4 can be efficiently cooled with cooling air. Further, since the light radiation is performed while the semiconductor wafer W is being rotated, it is possible to prevent the degree of uniformity of the distribution of illumination from being deteriorated.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications.

What is claimed is:

1. A lamp unit comprising:

a first plurality of filament lamps, for treating a workpiece, are arranged in a first plane, wherein each filament lamp has an annular light emitting tube and wherein each of said first plurality of filament lamps has a different diameter, wherein said first plurality of filament lamps are arranged concentrically with each other; and a second plurality of filament lamps arranged in a second plane, on the same side of the workpiece as the first plurality of filament lamps, wherein each filament lamp has an annular light emitting tube and wherein each of said second plurality of filament lamps has a different diameter, wherein said second plurality of filament lamps are arranged concentrically with each other, and wherein said first plurality of filament lamps and said second plurality of filament lamps are coaxial.

2. A light radiation heating device comprising:

a lamp chamber;

a first plurality of filament lamps, for treating a workpiece, are arranged in a first plane in said lamp chamber, wherein each filament lamp has an annular light emitting tube and wherein each of said first plurality of filament lamps has a different diameter, wherein said first plurality of filament lamps are arranged concentrically with each other; and a second plurality of filament lamps arranged in a second plane on the same side of the workpiece as the first plurality of filament lamps in said lamp chamber, wherein each filament lamp has an annular light emitting tube and wherein each of said second plurality of filament lamps has a different diameter, wherein said second plurality of filament lamps are arranged concentrically with each other, and wherein said first plurality of filament lamps and said second plurality of filament lamps are coaxial, wherein said lamp chamber includes a cooling air inlet port and a cooling air outlet port.

3. A light radiation heating device comprising:

a lamp chamber;

a first plurality of filament lamps, for treating a workpiece, are arranged in a first plane in said lamp chamber, wherein each filament lamp has an annular light emitting tube and wherein each of said first plurality of filament lamps has a different diameter, wherein said first plurality of filament lamps are arranged concentrically with each other; and a second plurality of filament lamps arranged in a second plane on the same side of the workpiece as the first plurality of filament lamps in said lamp chamber, wherein each filament lamp has an annular light emitting tube and wherein each of said second plurality of filament lamps has a different diameter, wherein said second plurality of filament lamps are arranged concentrically with each other, and wherein said first plurality of filament lamps and said second plurality of filament lamps are coaxial, wherein said lamp chamber includes a mirror on an inner side wall.

4. A light radiation heating device comprising:

a lamp chamber;

a first plurality of filament lamps, for treating a workpiece, are arranged in a first plane in said lamp chamber, wherein each filament lamp has an annular light emitting tube and wherein each of said first plurality of filament lamps has a different diameter, wherein said first plurality of filament lamps are arranged concentrically with each other;

a second plurality of filament lamps arranged in a second plane on the same side of the workpiece as the first plurality of filament lamps in said lamp chamber, wherein each filament lamp has an annular light omitting tube and wherein each of said second plurality of filament lamps has a different diameter, wherein said second plurality of filament lamps are arranged concentrically with each other, and wherein said first plurality of filament lamps and said second plurality of filament lamps are coaxial centers;

a light radiation chamber below said lamp chamber; and a rotatably mounted workpiece holding block arranged in said light radiation chamber.

* * * * *